(12) United States Patent
Hecht et al.

(10) Patent No.: US 12,426,436 B2
(45) Date of Patent: Sep. 23, 2025

(54) EMISSION OF ELECTROMAGNETIC RADIATION AND CONTROL OF THE PROPERTIES OF THE EMITTED ELECTROMAGNETIC RADIATION

(71) Applicant: Julius-Maximilians-Universität Würzburg, Würzburg (DE)

(72) Inventors: Bert Hecht, Zell (DE); Jens Pflaum, Dettelbach (DE); Rene Kullock, Wurzburg (DE); Stefan Zeissner, Hausen (DE); Monika Emmerling, Wurzburg (DE); Philipp Grimm, Wurzburg (DE); Enno Schatz, Wurzburg (DE)

(73) Assignee: Julius-Maximilians-Universitat Wurzburg, Wurzburg (DE)

( * ) Notice: Subject to any disclaimer, the term of this patent is extended or adjusted under 35 U.S.C. 154(b) by 558 days.

(21) Appl. No.: 17/543,990

(22) Filed: Dec. 7, 2021

(65) Prior Publication Data

US 2022/0190205 A1 Jun. 16, 2022

(30) Foreign Application Priority Data

Dec. 11, 2020 (EP) .................................... 20213289

(51) Int. Cl.
*H10K 50/11* (2023.01)
*H10H 20/816* (2025.01)
*H10H 20/833* (2025.01)
*H10K 39/30* (2023.01)

(52) U.S. Cl.
CPC .......... *H10K 50/11* (2023.02); *H10H 20/816* (2025.01); *H10H 20/833* (2025.01); *H10K 39/30* (2023.02)

(58) Field of Classification Search
CPC ......... H01L 33/42; H01L 33/14; H10K 50/11; H10K 39/30; H10H 20/816; H10H 20/833

See application file for complete search history.

(56) References Cited

U.S. PATENT DOCUMENTS

| 9,685,624 | B2* | 6/2017 | Reusch | H10K 50/19 |
| 10,069,095 | B2* | 9/2018 | Forrest | H10K 30/353 |
| 2006/0108578 | A1* | 5/2006 | Liu | H10K 30/81 |
| | | | | 257/40 |
| 2006/0228974 | A1* | 10/2006 | Thelss | H01L 29/7869 |
| | | | | 445/24 |

(Continued)

FOREIGN PATENT DOCUMENTS

WO 2009/143801 A1 12/2009

OTHER PUBLICATIONS

European Search Report dated Jun. 11, 2021, issued in European Application No. 20213289.0 filed Dec. 11, 2020.

(Continued)

*Primary Examiner* — Eugene Lee
(74) *Attorney, Agent, or Firm* — Workman Nydegger

(57) ABSTRACT

Provided is a device for emitting electromagnetic radiation. The device includes a first electrode, a second electrode, and an exciton recombination layer extending from the first electrode to the second electrode. The device is configured to relocate a recombination zone in the exciton recombination layer by changing an electric field between the first electrode and the second electrode, or to emit electromagnetic radiation through a transparent substrate.

12 Claims, 8 Drawing Sheets

(56) References Cited

U.S. PATENT DOCUMENTS

| | | | | |
|---|---|---|---|---|
| 2007/0044836 | A1* | 3/2007 | Forrest | H10K 30/20 |
| | | | | 136/263 |
| 2010/0282309 | A1* | 11/2010 | Pschirer | H01G 9/2072 |
| | | | | 438/57 |
| 2014/0000714 | A1* | 1/2014 | Rand | B82Y 10/00 |
| | | | | 438/82 |
| 2014/0299864 | A1* | 10/2014 | Urano | C08G 61/12 |
| | | | | 570/183 |
| 2014/0332794 | A1* | 11/2014 | Birnstock | H10K 71/20 |
| | | | | 438/22 |
| 2015/0207090 | A1* | 7/2015 | Lassiter | H10K 85/6574 |
| | | | | 257/40 |
| 2015/0311466 | A1* | 10/2015 | Jaeger | H10K 85/311 |
| | | | | 438/46 |
| 2016/0181560 | A1 | 6/2016 | Yamamoto et al. | |
| 2016/0254101 | A1* | 9/2016 | Forrest | H10K 30/211 |
| | | | | 136/256 |
| 2017/0179198 | A1* | 6/2017 | Li | H10K 30/82 |
| 2018/0122873 | A1* | 5/2018 | Zhou | H01L 33/06 |
| 2018/0301288 | A1* | 10/2018 | Irwin | H10K 30/82 |
| 2020/0203638 | A1* | 6/2020 | Thompson | H10K 85/342 |
| 2021/0028361 | A1* | 1/2021 | Forrest | H10K 71/40 |
| 2021/0098725 | A1* | 4/2021 | Forrest | H10K 30/30 |
| 2023/0129581 | A1* | 4/2023 | Fusella | H10K 50/852 |
| | | | | 257/40 |
| 2024/0099038 | A1* | 3/2024 | Kubota | H10K 50/858 |

OTHER PUBLICATIONS

Yuriy Zakharko et al., *On-Demand Coupling of Electrically Generated Excitons with Surface Plasmons via Voltage-Controlled Emission Zone Position*, ACS Photonics, vol. 3, No. 1, Jan. 2016, pp. 1-8.

S. Welter et al., *Electroluminescent Device with Reversible Switching Between Red and Green Emission*, Nature, vol. 421, Jan. 2, 2003, pp. 54-57.

Kevin C.Y. Huang et al., *Antenna Electrodes for Controlling Electroluminescence*, Nature Communications, 3:1005, DOI: 10.1038, Aug. 14, 2012, pp. 1-6.

Extended European Search Report dated Jun. 11, 2021, issued in European Application No. 20213289.0 filed Dec. 11, 2020.

* cited by examiner

EMISSION OF ELECTROMAGNETIC RADIATION AND CONTROL OF THE PROPERTIES OF THE EMITTED ELECTROMAGNETIC RADIATION

CROSS-REFERENCE TO RELATED APPLICATIONS

This application claims priority to European Application No. EP 20 213 289.0, filed Dec. 11, 2020, which is incorporated herein by specific reference.

FIELD

The present disclosure relates to the emission of electromagnetic radiation and to the control of the properties of the emitted electromagnetic radiation. In particular, the present disclosure relates to electromagnetic radiation initiated by electronic excitation, wherein the properties (e.g., the spectrum, the directivity, the polarization, etc.) of the electromagnetic radiation are controlled by one or more (nanoscale) optical antennas.

BACKGROUND

The emission of electromagnetic radiation such as light may be achieved by injecting electrons and holes into an excitonic material where the electrons and holes form excitons that emit electromagnetic radiation upon recombination. The properties of the electromagnetic radiation may be controlled by an optical antenna as described in Huang, K., Seo, M., Huo, Y. et al. Antenna electrodes for controlling electroluminescence. *Nat Commun* 3, 1005 (2012).

SUMMARY

The present invention is directed at devices for emitting electromagnetic radiation and a method of controlling properties of electromagnetic radiation.

A first device according to the present invention comprises a first electrode, a second electrode, and an exciton recombination layer extending from the first electrode to the second electrode. The device is configured to relocate a recombination zone in the exciton recombination layer by changing an electric field between the first electrode and the second electrode.

In this regard, the terms "first electrode" and "second electrode", as used throughout the description and the claims, particularly refer to electrically conductive structures which are to differ in electrical potential during operation of the device. The difference in electric potential may cause the injection of charge carries (holes and electrons) into the exciton recombination layer. The electrodes may be made of various conducting materials such as aluminum, copper, silver, gold, platinum, etc. and may differ in size and/or shape.

The term "exciton recombination layer", as used throughout the description and the claims, particularly refers to a layer comprising excitonic material, e.g., an organic semiconductive material such as, for example, zinc phthalocyanine (ZnPc). The exciton recombination layer may have a constant thickness and may be deposited over a substrate. Furthermore, the term "recombination zone", as used throughout the description and the claims, particularly refers to a portion of the exciton recombination layer in which the excitons formed by the charge carriers (that are injected by the electrodes) recombine.

The device may be configured to relocate the recombination zone by reversing a polarity of the first and second electrodes.

For example, the mobility of holes and electrons in the exciton recombination layer may be substantially different and this may cause the recombination zone to be displaced from a center between the electrodes towards the electrode that injects the charge carriers that are less mobile. Similarly, the rates at which holes and electrons are injected into the exciton recombination layer (at comparable conditions) may be substantially different and this may cause the recombination zone to be displaced from the center towards the electrode that (initially) injects less charge carriers.

The distance between the recombination zone and each of the electrodes may thus depend on the difference in mobility and/or injectability of the charge carriers. Accordingly, changing the mobility and/or injectability of the holes or electrons may allow relocating the recombination zone. Likewise, by reversing the polarity of the first and second electrodes, the recombination zone may be relocated towards the electrode that injects the charge carriers that are subject to relatively lower mobility and/or injectability.

The first electrode may cause a first electromagnetic radiation spectrum if the relocated recombination zone couples to the first electrode and the second electrode may cause a second electromagnetic radiation spectrum if the relocated recombination zone couples to the second electrode, wherein the first spectrum and the second spectrum differ.

In this regard, the formulation that a "recombination zone couples to [an] electrode", as used throughout the description and the claims, particularly refers to a scenario in which the recombination takes place in the vicinity of the electrode and the electrode influences the properties (e.g., the spectrum, the directivity, etc.) of the electromagnetic radiation caused by the recombination.

The electrodes may have a (special) shape that (intentionally) causes them to act like antennas, i.e., structures that can efficiently emit electromagnetic waves (e.g., photons of a particular wavelength).

The first electrode may be configured to serve as a first optical antenna if the relocated recombination zone couples to the first electrode and the second electrode may be configured to serve as a second optical antenna if the relocated recombination zone couples to the second electrode, wherein the first antenna and the second antenna differ in shape and/or orientation.

If the exciton recombination takes place in the vicinity of the electrode, it may cause a resonant excitation of antenna plasmons which efficiently decay into photons (thereby acting as optical antenna).

The first optical antenna and the second optical antenna may differ in directivity and/or polarization.

A size of the first optical antenna may be below 1 μm and a size of the second optical antenna may be below 1 μm.

In particular, the antennas may be smaller than a wavelength of the emitted electromagnetic radiation or smaller than a shortest wavelength of the spectrum of the emitted electromagnetic radiation.

A material of the exciton recombination layer may allow either for higher hole mobility than electron mobility, or for higher electron mobility than hole mobility, or for similar electron and hole mobilities.

The hole mobility may be substantially constant across the exciton recombination layer (and may also differ from the electron mobility).

The electron mobility may be substantially constant across the exciton recombination layer (and may also differ from the hole mobility).

For example, the exciton recombination layer may be made of a substantially homogeneous material (that is homogeneously deposited above the substrate).

A barrier between the electrodes and the exciton recombination layer may allow either for higher hole injectability than electron injectability or for higher electron injectability than hole injectability.

For instance, under identical conditions (except for the inversion of the electric field across the barrier), the holes (or electrons) may be injected at a rate which is at least two times higher than a rate at which the electrons (or holes) may be injected. The barrier may be a Schottky barrier formed at a metal-semiconductor junction.

The device may be configured to control a radial intensity distribution of the electromagnetic radiation based on a voltage difference between the first electrode and the second electrode.

The device may further comprise a third electrode, wherein the device is configured to relocate the recombination zone in the exciton recombination layer by changing the electric field between the first electrode, the second electrode, and the third electrode.

For example, the recombination zone may be relocated towards one of the electrodes by causing said electrode to have the highest or lowest potential of the electrodes.

The third electrode may serve as a gate electrode.

The device may further comprise a transparent substrate, wherein the first and second electrodes are formed on the transparent substrate. For example, the substrate may comprise glass.

The device may be configured to emit the electromagnetic radiation through the transparent substrate.

The transparent substrate may serve as a wave guide and the electromagnetic radiation may be guided into an optical waveguide.

The device may be an optical communication device.

The device may be a display.

A second device according to the present invention comprises a transparent substrate, a first electrode formed on the transparent substrate, a second electrode formed above the first electrode, and an exciton recombination layer between the first electrode to the second electrode, wherein the device is configured to emit the electromagnetic radiation through the transparent substrate.

The device may be a display or an optical communication device.

The method according to the present invention comprises deactivating a first optical antenna of two, three or more optical antennas and activating a second optical antenna of the two, three or more optical antennas by reversing a polarity of the first and second optical antennas. The reversing causes an exciton recombination zone in an exciton recombination layer extending from the first optical antenna to the second optical antenna to decouple from the first optical antenna and couple to the second optical antenna.

The first optical antenna may emit electromagnetic radiation in a first spectrum and the second optical antenna may emit electromagnetic radiation in a second spectrum which differs from the first spectrum and/or the first optical antenna and the second optical antenna may lead to differences in directivity and/or polarization of the emitted electromagnetic radiation.

The two, three or more optical antennas may form a pixel of a display. By switching between the optical antennas, the light emitted by the pixel may take on different colors (which define an additive color space).

Notably, the (optional) features of the devices may be (optional) features of the method and vice versa.

BRIEF DESCRIPTION OF DRAWINGS

The foregoing aspects and many of the attendant advantages will become more readily appreciated as the same become better understood by reference to the following description of embodiments, when taken in conjunction with the accompanying drawings, wherein like reference numerals refer to like parts throughout the various views, unless otherwise specified.

Notably, the drawings are not drawn to scale and unless otherwise indicated, they are merely intended to conceptually illustrate the structures and procedures described herein.

DESCRIPTION OF EMBODIMENTS

Figure 1A:
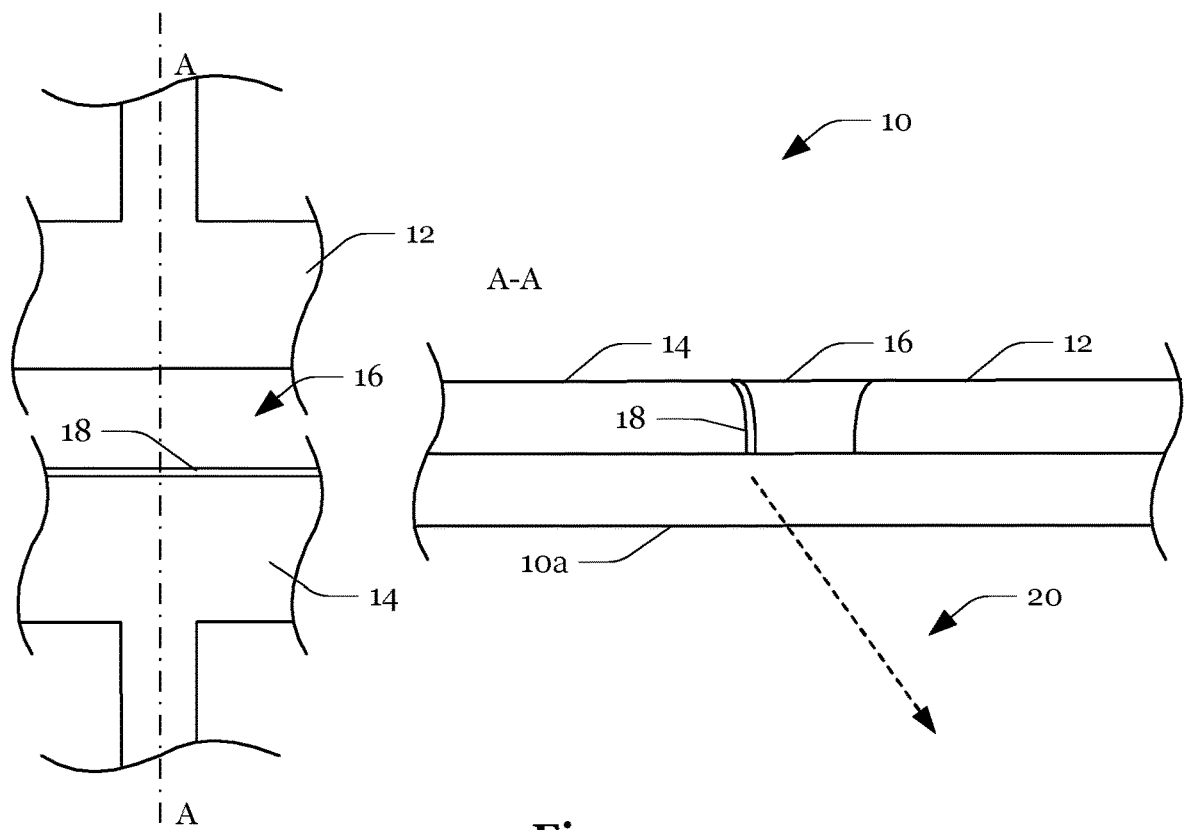
FIG. 1a and FIG. 1b illustrate relocating the recombination zone in an exciton recombination layer.

FIG. 1a shows device 10 comprising electrodes 12 and 14 and exciton recombination layer 16 which connects electrode 12 to electrode 14. Exciton recombination layer 16 may be formed from a transition metal dichalcogenide (TMDC) monolayer or an organic semiconductor material such as self-assembled monolayers, Zinc phthalocyanine (ZnPc), etc. The organic semiconductor material may be deposited by thermal evaporation (generating a 20 nm to 40 nm thick weakly absorbing homogeneous layer) after electrode 12 and electrode 14 have been formed on a (transparent) substrate 10a.

When a voltage applied to electrode 12 and electrode 14 is above a threshold, electrons and holes may be injected into exciton recombination layer 16. The injected electrons and holes may recombine and decay within recombination zone 18, causing the emission of electromagnetic radiation 20. If electron mobility and hole mobility differ (substantially), recombination zone 18 may be closer to one of electrodes 12 and 14, and farther away from the other one of electrodes 12 and 14.

Figure 1B:
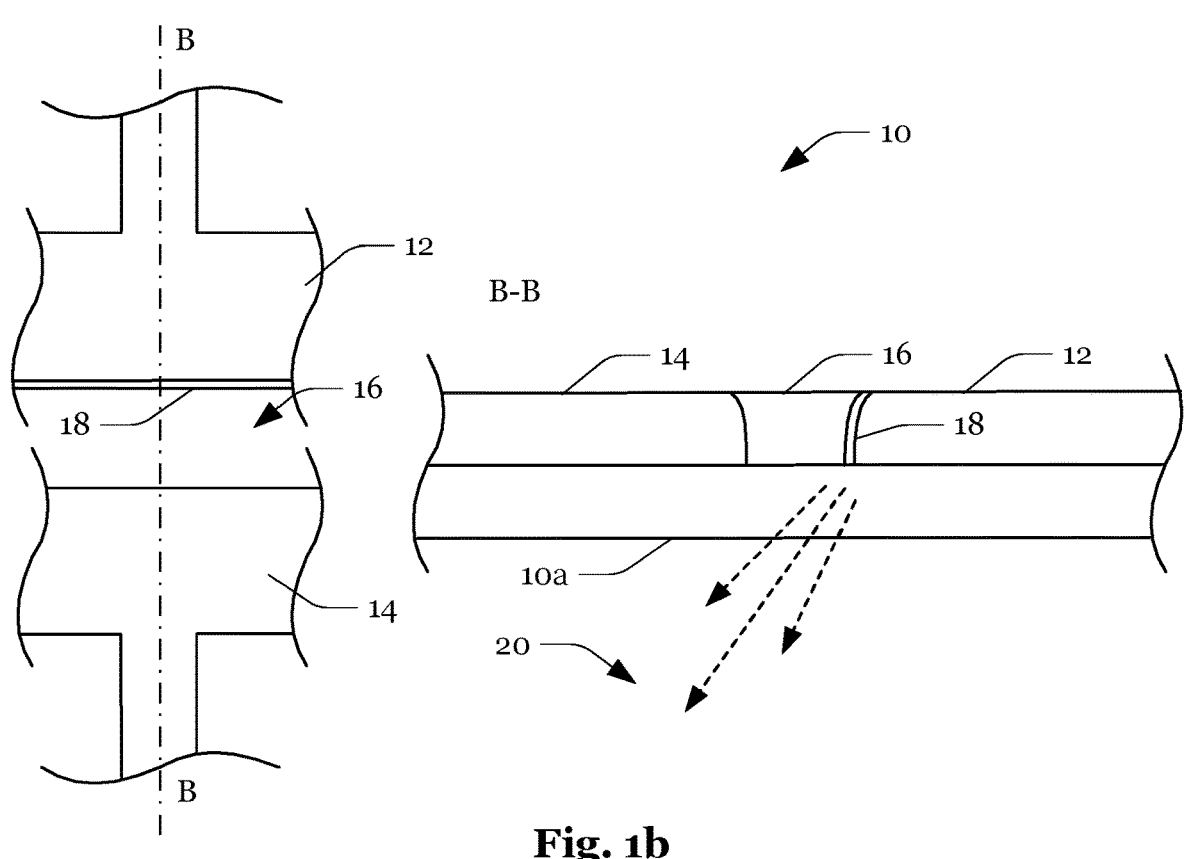

In FIG. 1a, the electron mobility may be lower than the hole mobility and electrode 12 may have a higher electric potential than electrode 14, or the electron mobility may be lower than the hole mobility and electrode 12 may have a lower electric potential than electrode 14. In FIG. 1b, the electron mobility may be lower than the hole mobility and electrode 12 may have a lower electric potential than electrode 14, or the electron mobility may be lower than the hole mobility and electrode 12 may have a higher electric potential than electrode 14.

As illustrated by FIG. 1a and FIG. 1b, the directivity of the emission may be influenced by features (i.e., electrodes 12 and 14) in the vicinity of recombination zone 18. Likewise, the polarization and/or the spectrum of the emission may be influenced by features in the vicinity of recombination zone 18. Thus, the directivity, the polarization and/or the spectrum of electromagnetic radiation 20 may be controlled (to some extent) by relocating recombination zone 18 within exciton recombination layer 16, e.g., by moving recombination zone 18 towards or away from one of electrodes 12 and 14.

Figure 2A:
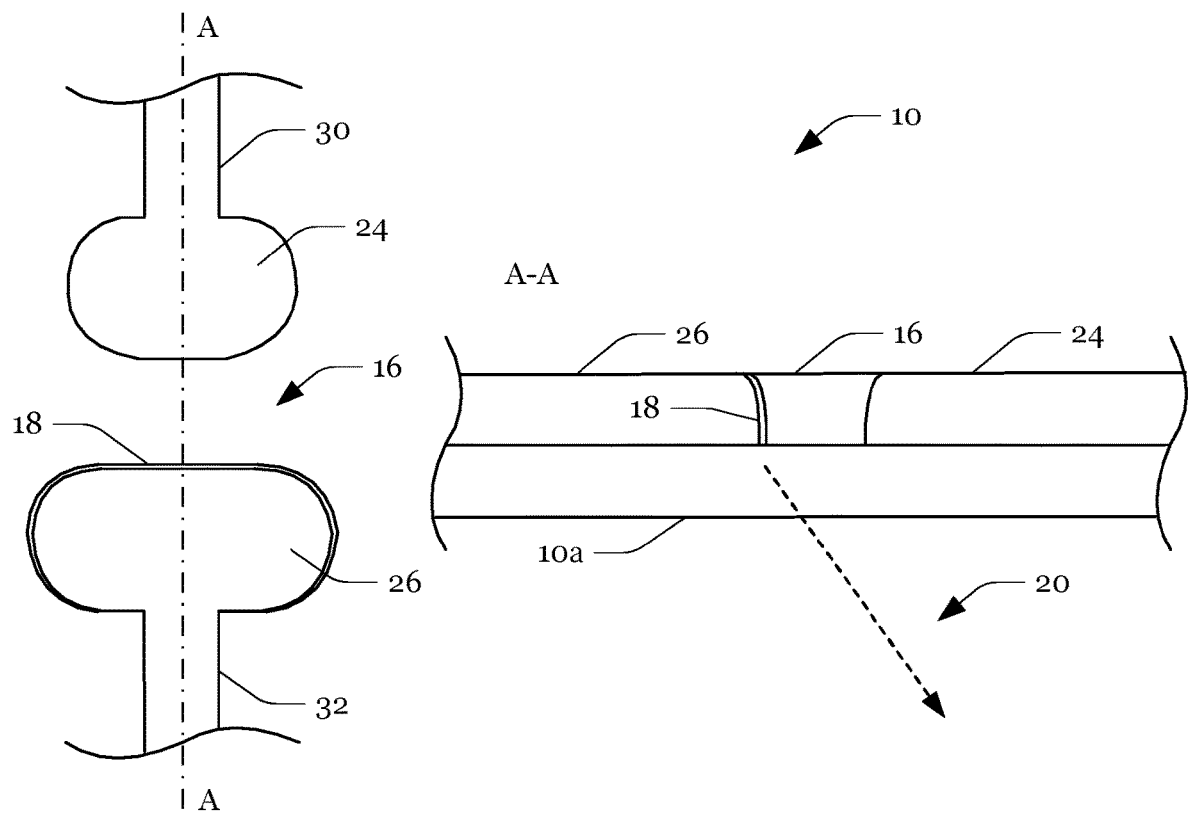
FIG. 2a and FIG. 2b illustrate decoupling the recombination zone from a first antenna and coupling the recombination zone to a second antenna and the related spectral shift.
Figure 2A:
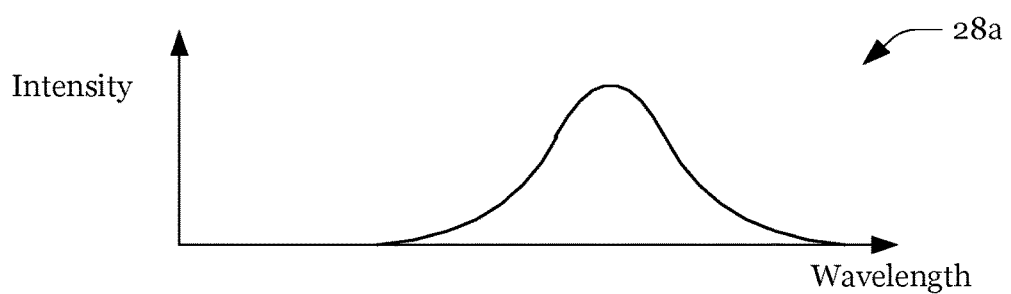
Figure 2B:
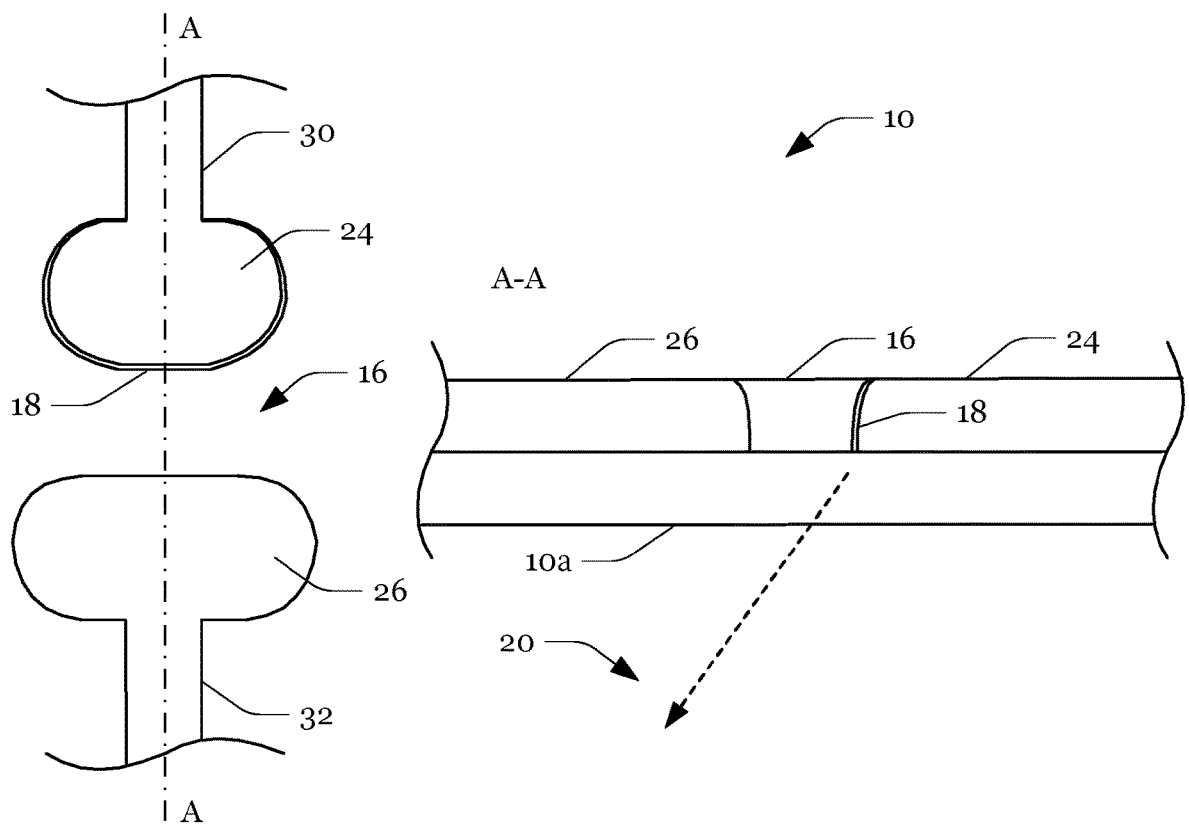
Figure 2B:
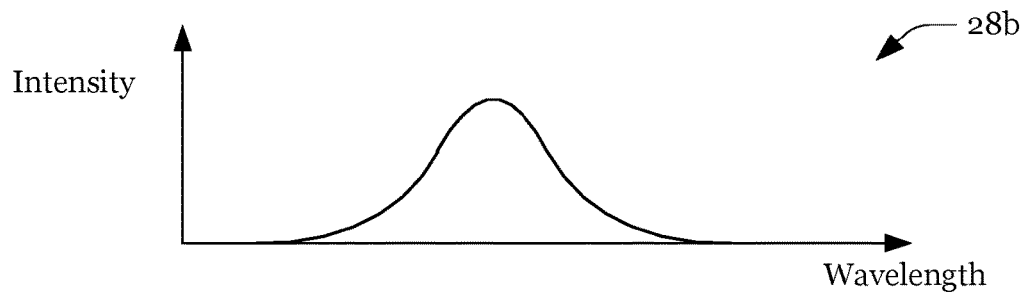

As illustrated in FIGS. 2a and 2b, electrodes 12 and 14 may be laterally arranged and parallelly oriented (nontransparent) nanostructures (e.g., nanorods) which differ (primarily) in size and which serve as (plasmonic) antennas 24 and 26. Antennas 24 and 26 may also differ (primarily) in shape and may be oriented along non-parallel axes. Depending on the polarity of the voltage applied to antennas 24 and 26, recombination zone 18 may couple selectively to either one of antennas 24 and 26.

As antennas 24 and 26 differ in size, the spectral and spatial emission characteristics, determined by the coupling of recombination zone 18 to the respective nearest antenna 24 or 26, depend on the polarity of the applied voltage. For example, when recombination zone 18 decouples from larger antenna 26 and couples to smaller antenna 24, the spectrum of electromagnetic radiation 20 may shift from spectrum 28a to spectrum 28b, i.e., electromagnetic radiation 20 may shift to smaller wavelengths. Likewise, when recombination zone 18 decouples from smaller antenna 24 and couples to larger antenna 26, the spectrum of electromagnetic radiation 20 may shift from spectrum 28b back to spectrum 28a, i.e., electromagnetic radiation 20 may shift to larger wavelengths.

Thus, reversing the polarity of the applied voltage may cause a spectral shift of electromagnetic radiation 20 which may be used, for example, to change a color of a pixel of a screen or to encode data. Moreover, reversing the polarity of the applied voltage may also cause a change in the directivity and/or the polarization of the emitted electromagnetic radiation 20. A change in the directivity may be used to switch between more focused and less focused electromagnetic radiation 20 or between different emission angles. As a result, electromagnetic radiation 20 may travel along different (optical) paths, a pixel may be made (more clearly) visible from different angles, electromagnetic radiation 20 may be coupled into different waveguides, etc.

Antennas 24 and 26 may be single-crystal electrically connected antennas which are fabricated by focused ion beam milling from single-crystal gold platelets. For example, antenna 24 and antenna 26 may be two horizontal gold bars of different lengths with resonances that overlap with a photoluminescence spectrum of the excitonic material but are sufficiently apart from each other to provide two distinguishable spectral signatures. The distance between antenna 24 and antenna 26 may be such that both resonances show no sign of hybridization.

Antenna 24 and antenna 26 may be connected to (relatively) large (gold) contact pads by (relatively) thin (gold) lines 30 and 32. The thin lines 30 and 32 may extend along symmetry axes of antenna 24 and antenna 26, respectively, to avoid any disturbance of the plasmon modes.

When applying a voltage (e.g., 10 V) to antenna 24 and antenna 26, the emission of electromagnetic radiation 20 may be observed in the form of a diffraction-limited spot localized at the position of the antenna pair. However, instead of a broadband emission generated by the resonances of both antennas 24 and 26, spectrum 28a and 28b of electromagnetic radiation 20 may depend (strongly) on the polarity of the applied voltage. For instance, spectrum 28a may have a peak at about 900 nm whereas spectrum 28b may have a peak at about 830 nm.

If the excitonic material is ZnPc, the polarity-dependent spectral shift may be due to the fact that ZnPc is a preferential hole conductor. This means that holes may propagate across the entire ZnPc layer without inducing radiative charge carrier recombination processes until they reach the vicinity of the antenna which injects electrons into exciton recombination layer 16. As the electrons may be injected (e.g., by tunneling or thermal activation) at a much lower efficiency across the Schottky barrier, excitons may be formed close to the antenna that serves as the cathode. In other words, the unequal electron and hole mobilities may lead to an asymmetric position of recombination zone 18 closer to the antenna which serves as the cathode.

Due to the proximity of a plasmonic antenna, the excitonic decay may be enhanced within the bandwidth of the respective antenna resonance which may lead to the excitation of antenna plasmons that efficiently decay into photons.

In addition to the changes of the spectrum caused by the polarity switching, there may also be changes in the emission pattern. The structure of antenna 24 and antenna 26 resembles that of a Yagi-Uda antenna with the additional feature that the active and the passive element can be interchanged by reversing the polarity. Thus, the directionality of electromagnetic radiation 20 may change as the polarity is switched. Without a reflector on top of antennas 24 and 26, the directivity may be beyond the critical angle of total internal reflection of transparent substrate 10a.

Figure 3:
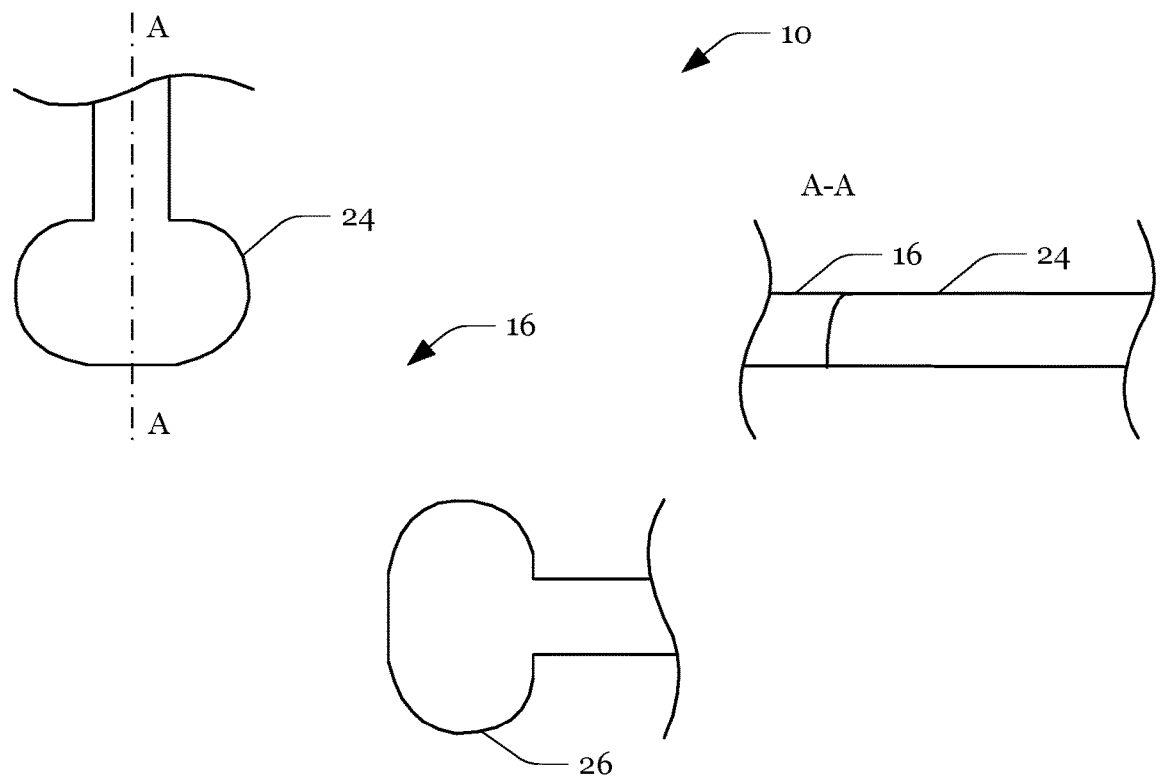
FIG. 3 shows a top view and a cross-sectional view of a first exemplary embodiment of a device according to the present invention.
Figure 4:
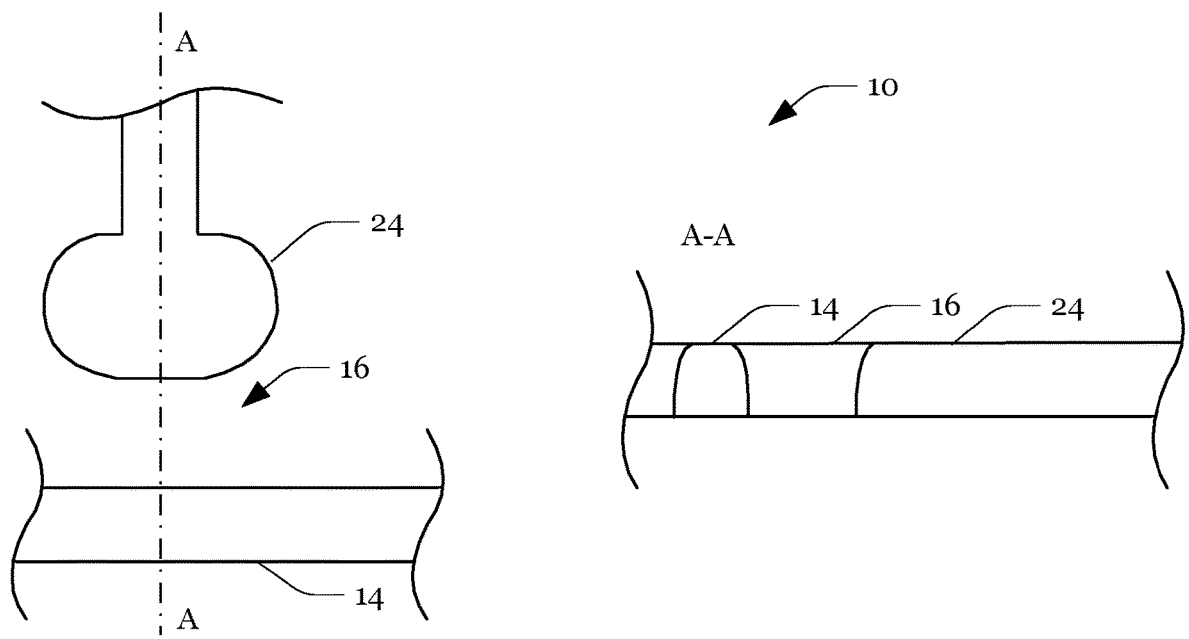
FIG. 4 shows a top view and a cross-sectional view of a second exemplary embodiment of a device according to the present invention.

As illustrated in FIG. 3, antenna 24 and antenna 26 may be perpendicular to each other to allow for polarization switching. Moreover, as illustrated in FIG. 4, antenna 24 may be paired with counter electrode 14. Whenever recombination zone 18 couples to antenna 24, electromagnetic radiation 20 with a characteristic spectrum is being emitted. Whenever recombination zone 18 couples to electrode 14, electromagnetic radiation 20 with a different spectrum is being emitted.

Figure 5:
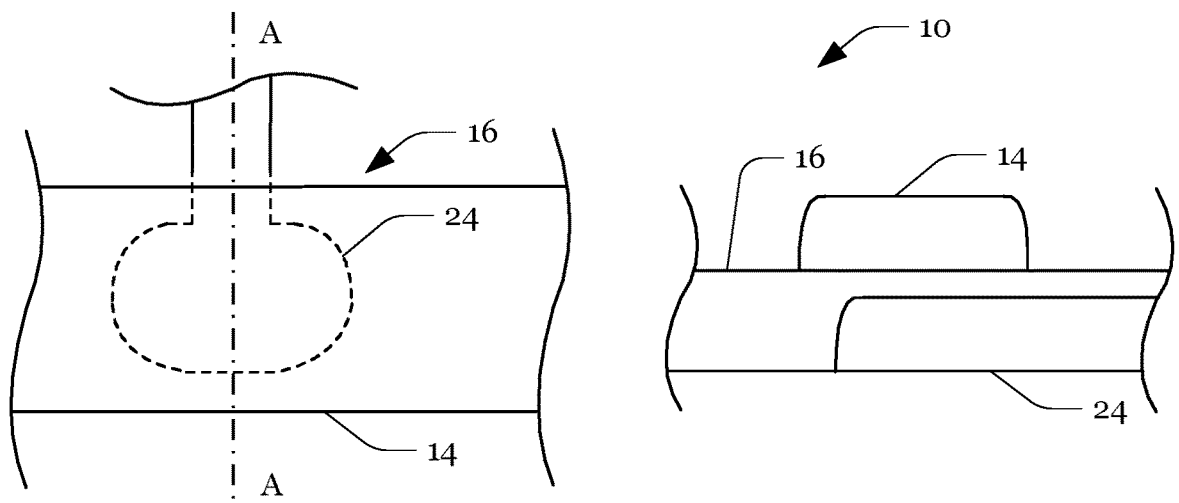
FIG. 5 shows a top view and a cross-sectional view of a third exemplary embodiment of a device according to the present invention.

As illustrated in FIG. 5, electrode 14 may be arranged above antenna 24 (with exciton recombination layer 16 being sandwiched by electrode 14 and antenna 24) and serve as a reflector. For example, electrode 14 may be a (gold) layer. The reflector may redirect the emitted electromagnetic radiation perpendicular to the layer. Notably, switching the directionality by reversing the polarity may be less pronounced if a reflector is used.

Figure 6:
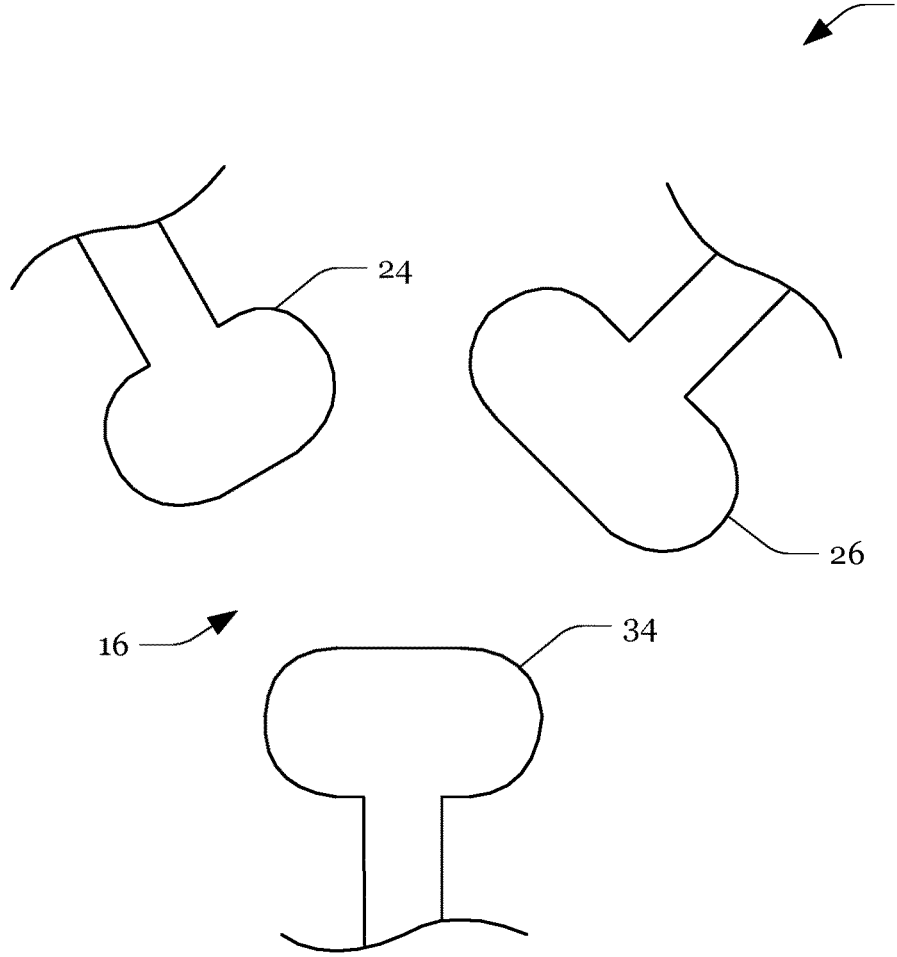
FIG. 6 shows a top view of a fourth exemplary embodiment of a device according to the present invention.
Figure 7:
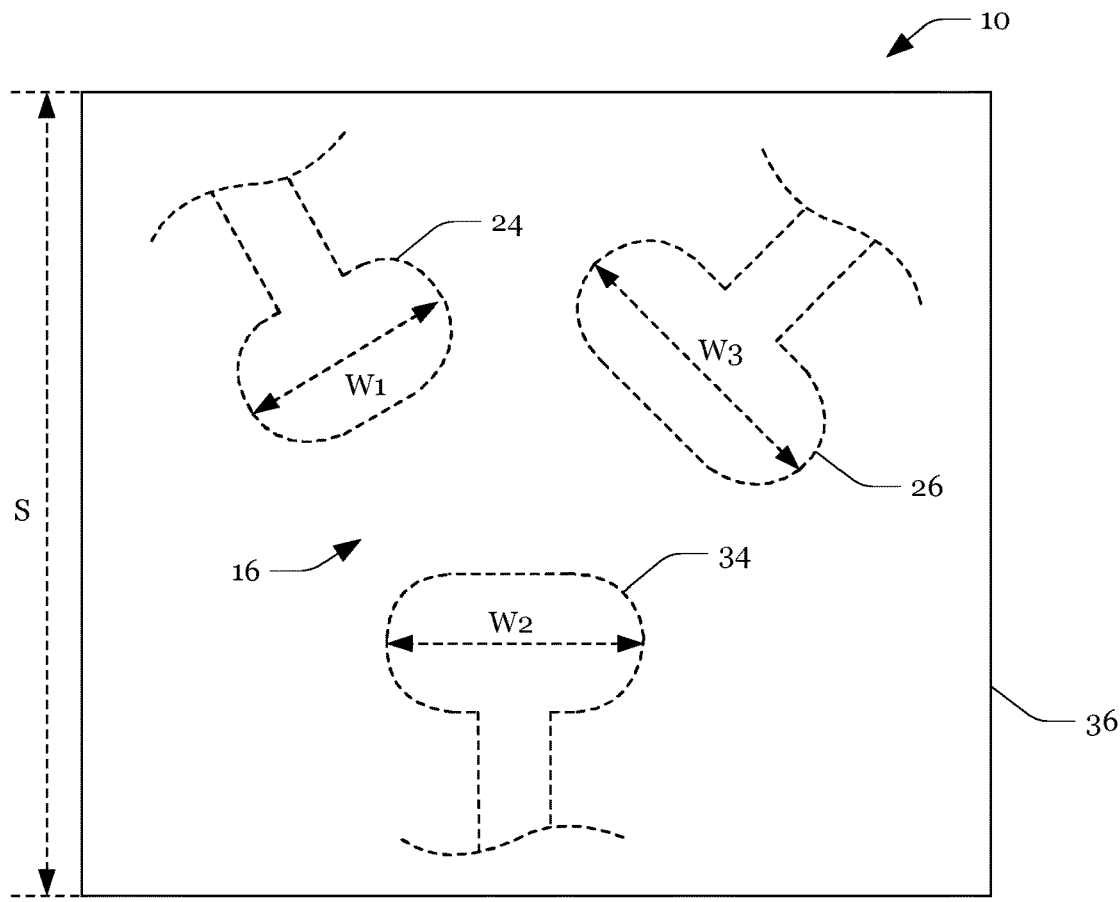
FIG. 7 shows a top view of a fifth exemplary embodiment of a device according to the present invention.

As illustrated in FIG. 6, device 10 may comprise more than two antennas 24, 26 and 34, which have different resonance lengths. For example, antennas 24, 26 and 34 may be used to realize a three-color single pixel (using an in-plane design as in FIG. 4). As shown in FIG. 7, electrode 36 may be arranged above antennas 24, 26 and 34 with exciton recombination layer 16 being sandwiched by electrode 36 and antennas 24, 26 and 34. The size S of electrode 36 may be about 3 µm to 4 µm. The widths W1, W2, and W3 of antennas 24, 26 and 34, respectively, may be between 100 nm and 400 nm.

Figure 8:
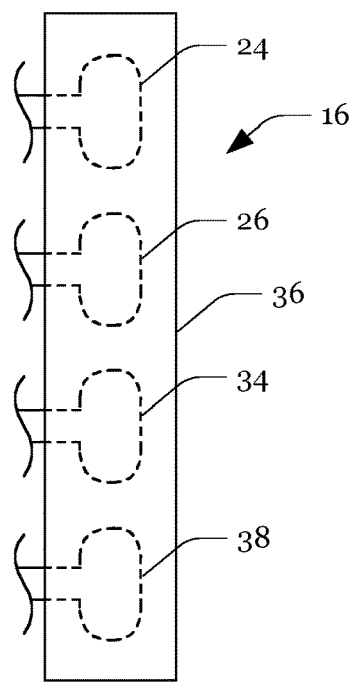
FIG. 8 shows a top view of a sixth exemplary embodiment of a device according to the present invention.
Figure 9:
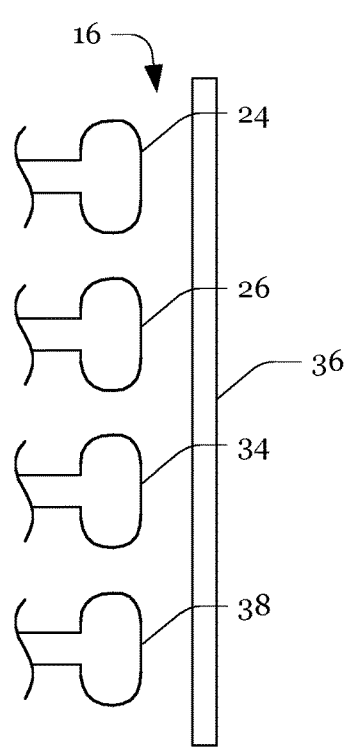
FIG. 9 shows a top view of a seventh exemplary embodiment of a device according to the present invention.
Figure 10:
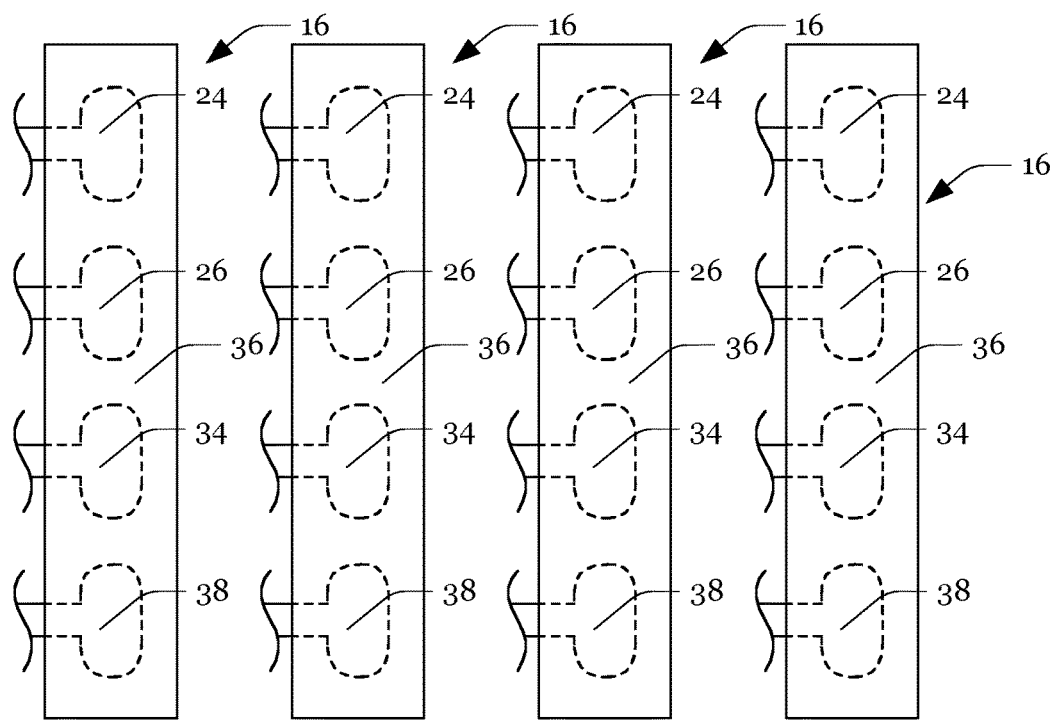
FIG. 10 shows a top view of an eighth exemplary embodiment of a device according to the present invention.
Figure 11:
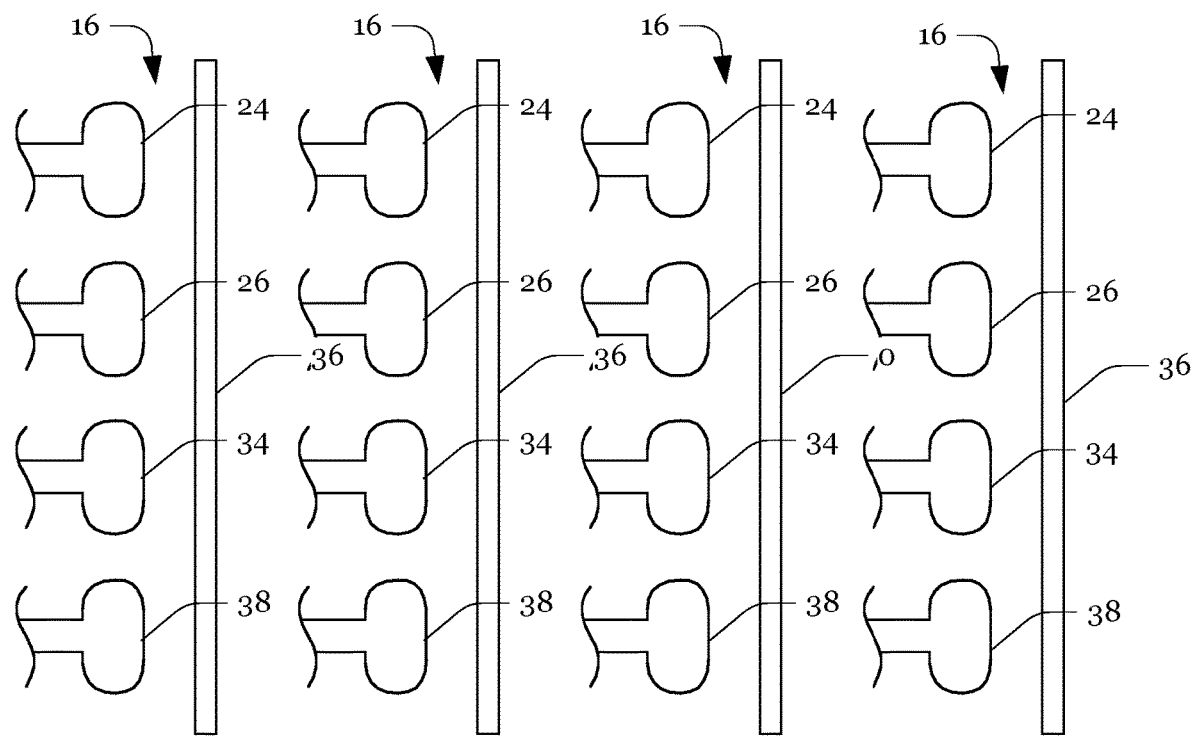
FIG. 11 shows a top view of a ninth exemplary embodiment of a device according to the present invention.

As illustrated in FIG. 8, device 10 may comprise a column of antennas 24, 26, 34, and 38 that share electrode 36 which is arranged above the column and serves as a reflector (similar to the arrangement shown in FIG. 5). Exciton recombination layer 16 is arranged between electrode 36 and antennas 24, 26, 34, and 38. When a reflector is used, a substrate on which antennas 24, 26, 34 and 36 are deposited may be transparent. Instead of the stacked design shown in FIG. 8, an in-plane design may be used as illustrated in FIG. 9. In FIG. 10 and FIG. 11, multiple columns as those shown in FIG. 8 and FIG. 9, respectively, are placed side by side. The resulting matrices may be used to produce a display.

Figure 12:
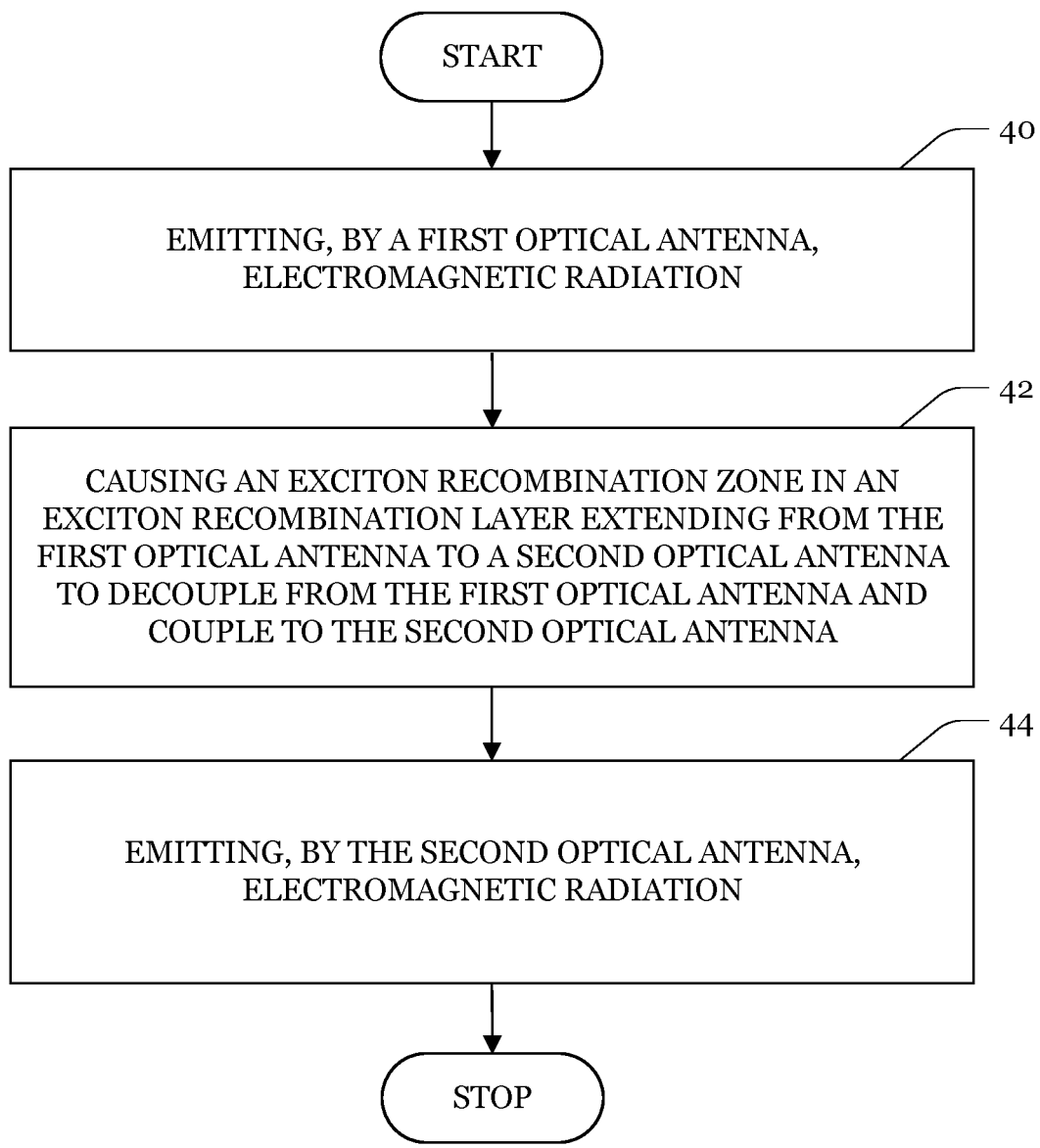
FIG. 12 shows steps of a process for controlling properties of the electromagnetic radiation.

FIG. 12 shows a flow-chart of a process for controlling spectrum 28a and 28b of electromagnetic radiation 20. The process starts at step 40 emitting electromagnetic radiation 20 by antenna 26. At step 42, the process is continued with deactivating antenna 26 and activating antenna 24 by reversing the polarity of antennas 24 and 26 which causes recombination zone 18 in exciton recombination layer 16 to decouple from antenna 26 and couple to antenna 24, wherein optical antenna 26 emits electromagnetic radiation 20 with spectrum 28a and antenna 24 emits electromagnetic radiation 20 with spectrum 28b which differs from spectrum 28a. At step 44, the process concludes with emitting electromagnetic radiation 20 by antenna 24.

REFERENCE SIGNS LIST 10 device
10a substrate
12 electrode
14 electrode
16 exciton recombination layer
18 recombination zone
20 electromagnetic radiation
22 features
24 antenna
26 antenna
28a spectrum
28b spectrum
30 line
32 line
34 antenna
36 electrode
38 antenna
40 step
42 step
44 step

What is claimed is:

1. A device for emitting electromagnetic radiation, comprising:
   a first electrode;
   a second electrode; and
   an exciton recombination layer extending from the first electrode to the second electrode;
   wherein the device is configured to move a recombination zone in the exciton recombination layer towards or away from one of the first or second electrodes by reversing a polarity of the first and second electrodes,
   wherein the first electrode and the second electrode differ in size, shape, and/or orientation, and
   wherein the first electrode and the second electrode comprise nanostructures having shapes to serve as optical antennas.

2. The device of claim 1, wherein the first electrode causes a first electromagnetic radiation spectrum if the moved recombination zone couples to the first electrode and the second electrode causes a second electromagnetic radiation spectrum if the moved recombination zone couples to the second electrode, wherein the first spectrum and the second spectrum differ.

3. The device of claim 2, where the first electrode is configured to serve as a first optical antenna if the moved recombination zone couples to the first electrode and the second electrode is configured to serve as a second optical antenna if the moved recombination zone couples to the second electrode.

4. The device of claim 3, wherein the first optical antenna and the second optical antenna differ in directivity and/or polarization.

5. The device of claim 1, wherein a material of the exciton recombination layer allows either for higher hole mobility than electron mobility or for higher electron mobility than hole mobility.

6. The device of claim 1, wherein a material of the exciton recombination layer allows either for higher hole injectability than electron injectability or for higher electron injectability than hole injectability.

7. The device of claim 1, wherein the device is configured to control a radial intensity distribution of the electromagnetic radiation based on a voltage difference between the first electrode and the second electrode.

8. The device of claim 1, further comprising:
   a third electrode;
   wherein the device is configured to relocate the recombination zone in the exciton recombination layer by changing the electric field between the first electrode, the second electrode, and the third electrode.

9. The device of claim 1, further comprising:
   a transparent substrate;
   wherein the first and second electrodes are formed on the transparent substrate.

10. The device of claim 9, wherein the device is a display or an optical communication device.

11. A device for emitting electromagnetic radiation, comprising:
    a transparent substrate;
    a first electrode formed on the transparent substrate;
    a second electrode formed above the first electrode; and
    an exciton recombination layer between the first electrode to the second electrode;
    wherein the device is configured to emit the electromagnetic radiation through the transparent substrate,
    wherein the first electrode and the second electrode differ in size, shape, and/or orientation, and
    wherein the first electrode and the second electrode comprise nanostructures having shapes to serve as optical antennas.

12. A method for emitting electromagnetic radiation, the method comprising:
    at a first electrode and a second electrode, the first electrode and the second electrode comprising nanostructures having shapes to serve as optical antennas and differing in size, shape, and/or orientation, the first electrode and second electrode having an exciton recombination layer extending from the first electrode to the second electrode, applying an electric field to the first electrode and second electrode causing a recombination zone in the exciton recombination layer to occur at a first location; and reversing a polarity of the first and second electrodes causing the recombination zone in the exciton recombination layer to occur at a second different location.

\* \* \* \* \*